US012761248B2

(12) United States Patent
Chou et al.

(10) Patent No.: US 12,761,248 B2
(45) Date of Patent: Oct. 13, 2026

(54) NON-CONTACT AC/DC SENSING PROBE AND SENSING METHOD AND APPLICATION THEREOF

(71) Applicants: MEET ELECTRONICS LTD., Dongguan (CN); Ronald Chi Kang Chou, Dongguan (CN)

(72) Inventors: Ronald Chi Kang Chou, Dongguan (CN); Kai Sheng Chou, Dongguan (CN)

(73) Assignees: Ronald Chou, Dongguan (CN); MEET ELECTRONICS LTD., Dongguan (CN)

( * ) Notice: Subject to any disclaimer, the term of this patent is extended or adjusted under 35 U.S.C. 154(b) by 151 days.

(21) Appl. No.: 18/776,393

(22) Filed: Jul. 18, 2024

(65) Prior Publication Data

US 2025/0044324 A1 Feb. 6, 2025

(30) Foreign Application Priority Data

Aug. 4, 2023 (CN) ......................... 202310981543.5

(51) Int. Cl.
*G01R 15/20* (2006.01)
*G01R 19/00* (2006.01)

(52) U.S. Cl.
CPC ....... *G01R 15/202* (2013.01); *G01R 19/0084* (2013.01)

(58) Field of Classification Search
None
See application file for complete search history.

(56) References Cited

U.S. PATENT DOCUMENTS 4,398,342 A * 8/1983 Pitt ........................ H10N 52/01 323/368
7,746,055 B2 * 6/2010 Bose .................... G01R 15/202 324/126

(Continued)

FOREIGN PATENT DOCUMENTS

CN 207851193 U 9/2018
CN 212321718 U 1/2021

(Continued)

OTHER PUBLICATIONS

The first search report of the counterpart CN application No. 2023109815435 issued on Sep. 22, 2025.

*Primary Examiner* — Richard Isla
(74) *Attorney, Agent, or Firm* — The Sun IP Law

(57) ABSTRACT

The present invention discloses a non-contact AC/DC sensing probe and a sensing method and application thereof. The non-contact AC/DC sensing probe adopts a Hall sensing module, breaks through the limitation that a traditional induction coil can sense only an AC current, and can directly perform AC/DC sensing on a single wire or a cable composed of two or more wires, so as to allow the target wire to generate an electromagnetic signal to be collected by the Hall sensing module, and sensing of electrical parameters, including a current, a voltage, a frequency, a duty cycle, a phase, a harmonic, a frequency-conversion signal, etc. is realized without peeling and cable branching, so that the non-contact AC/DC current sensing probe is simple and convenient to operate, can be applied to measuring instruments such as a test pen, a multimeter and a clamp meter, and has a wide range of applications.

7 Claims, 22 Drawing Sheets

(56) References Cited

U.S. PATENT DOCUMENTS

| | | | | |
|---|---|---|---|---|
| 7,979,221 | B2 * | 7/2011 | Gilbert | H04L 67/34<br>324/500 |
| 8,203,328 | B2 * | 6/2012 | Bose | G01R 15/207<br>336/178 |
| 9,000,752 | B2 * | 4/2015 | El-Essawy | G01R 15/202<br>324/126 |
| 9,829,516 | B1 * | 11/2017 | Ernst | G06F 1/28 |
| 10,283,955 | B2 * | 5/2019 | Cruz | H02H 3/08 |
| 10,451,678 | B2 * | 10/2019 | Lee | G01R 31/3648 |
| 11,237,192 | B2 * | 2/2022 | Rodriguez | G01R 15/148 |
| 2023/0130622 | A1 * | 4/2023 | Steinke | G01R 15/202<br>324/200 |

FOREIGN PATENT DOCUMENTS

| | | | |
|---|---|---|---|
| CN | 112816756 | A | 5/2021 |
| CN | 220671519 | U | 3/2024 |

* cited by examiner

NON-CONTACT AC/DC SENSING PROBE AND SENSING METHOD AND APPLICATION THEREOF

CROSS-REFERENCE TO RELATED APPLICATIONS

This application claims priority to Chinese Patent Application No. 202310981543.5, filed on Aug. 4, 2023, which is hereby incorporated by reference in its entirety.

TECHNICAL FIELD

The present invention relates to the technical field of measuring instruments, in particular to a non-contact AC/DC sensing probe and a sensing method and an application thereof.

BACKGROUND ART

There are a plurality of methods for current measurement, commonly including a shunt, an instrument transformer, a Hall effect sensor, a magnetic amplification current comparator, a magnetic modulation current comparator, and the like. When current measurement is performed in the field of electrical technology, it is usually required to measure a current accurately, quickly and conveniently. During application at engineering sites, if a current measuring device needs to be connected for measurement only after a circuit is cut off, it is time-consuming, laborious and unsafe, and it especially does not comply with relevant safety standards during measurement of a current of a normally operating power device. In this case, it is much more convenient to use a clamp-type current measuring device that can measure a current without cutting off the circuit.

The clamp-type current measuring device based on the Hall effect is a currently widely used current measurer. In a magnetic core of a current clamp based on the Hall effect, an air gap is processed to place a Hall element, and the Hall element is used to measure a magnetic flux density in the air gap.

For example, according to Chinese Invention Patent Application with publication number "CN112816756A" and entitled "HALL SENSOR DEVICE FOR MEASURING ALTERNATING CURRENT", a current measuring device and a current clamp meter are disclosed, comprising: a coil, an operational amplifier, an adder, a Hall sensor, and an iron core; wherein the coil is connected to an output end of the operational amplifier and an input end of the adder; and an input end of the operational amplifier is connected to the Hall sensor, and is used for collecting and amplifying a signal of the Hall sensor. Although the foregoing invention realizes the purpose of measuring an alternating current as well as a direct current, AC/DC measurement can be performed only on a single wire, and when a cable (except a shielded cable) is composed of two or more wires, AC/DC measurement cannot be directly performed, because when a clamp meter clamps two wires (such as a live wire and a zero wire) at the same time, magnetic fields generated by the two wires are counteracted in opposite directions, that is, a resultant magnetic field is zero, and a reading number of the clamp meter is zero, which cannot reflect the real current of the circuit. To this end, it is necessary to peel off an insulation protective layer of the cable and measure each wire separately, which is not only cumbersome to operate and inefficient in measurement, but also similarly intended to a problem of damaging the insulation protective layer, affecting use safety.

SUMMARY OF THE INVENTION

In view of the foregoing shortcomings, the purpose of the present invention is to provide a non-contact AC/DC sensing probe that is simple to operate and can directly perform AC/DC measurement on an unshielded cable, and a sensing method thereof.

In order to achieve the foregoing purpose, the present invention provides the following technical solutions.

A non-contact AC/DC sensing method, comprising the following steps: constructing a sealed shielding space for preventing electromagnetic interference, arranging a detection port that can allow an electromagnetic signal in a specific direction to enter the shielding space, and arranging, in the shielding space, a Hall sensing module that can collect the electromagnetic signal passing through the detection port to enter the shielding space; during sensing of a single wire, enabling the detection port to be close to but not in contact with the single wire, so that an electromagnetic signal generated when an AC/DC current flows in the single wire can be allowed to pass through the detection port to enter the shielding space to be collected by the Hall sensing module, and the Hall sensing module outputs a corresponding voltage signal; during sensing of a non-twisted cable formed by two or more wires arranged in parallel, enabling the detection port to be close to but not in contact with the non-twisted cable, and then rotating around the non-twisted cable, so that the detection port faces the wires in the non-twisted cable one by one, and an electromagnetic signal generated when an AC/DC current flows in a target wire in the non-twisted cable can be allowed to pass through the detection port to enter the shielding space to be collected by the Hall sensing module, and the Hall sensing module outputs a corresponding voltage signal; and during sensing of a twisted cable formed by two or more wires twisted together, enabling the detection port to be close to but not in contact with the twisted cable, and then rotating around the twisted cable and/or moving along a direction of a central axis of the twisted cable, so that an electromagnetic signal generated when an AC/DC current flows in a target wire in the twisted cable can be allowed to pass through the detection port to enter the shielding space to be collected by the Hall sensing module, and the Hall sensing module outputs a corresponding voltage signal.

Subsequently, the voltage signal output by the Hall sensing module is subjected to analytic operation processing by a main control MCU chip, to obtain related electrical parameters, and the electrical parameters comprise a current, a voltage, a frequency, a duty cycle, a phase, a harmonic, and a frequency-conversion signal.

A non-contact AC/DC sensing probe for implementing the non-contact AC/DC sensing method comprises a metal shielding shell and a Hall sensing module, wherein the metal shielding shell is used for constructing a sealed shielding space for preventing electromagnetic interference; the metal shielding shell is provided with a detection port that can allow an electromagnetic signal in a specific direction to enter the shielding space; and the Hall sensing module is located in the shielding space, and is used for sensing the electromagnetic signal that enters the metal shielding shell from the detection port and outputting a corresponding voltage signal.

As a preferred solution of the present invention, an iron rod is arranged beside the Hall sensing module for enhancing sensitivity thereof to a magnetic field change, and the iron rod can enhance the sensitivity of the Hall sensing module to the magnetic field change, so that sensing effect is improved, making it more sensitive and accurate.

As a preferred solution of the present invention, the Hall sensing module comprises a Hall element, a first signal amplification circuit, a second signal amplification circuit, and a noise filter circuit, the Hall element is connected to the first signal amplification circuit, the iron rod is connected to the second signal amplification circuit, and the metal shielding shell is connected to the noise filter circuit.

As a preferred solution of the present invention, the iron rod is a feeler pin of a test pen, thereby realizing multi-function detection, and the test pen is small in size and has a wide range of applications.

The non-contact AC/DC sensing probe is applied to a test pen or a measuring instrument.

The present invention has the following beneficial effects: the non-contact AC/DC sensing probe of the present invention is ingenious and reasonable in structural design, adopts the Hall sensing module, breaks through the limitation that a traditional induction coil can sense only an AC current, can perform sensing on an AC or DC current, and can directly perform AC/DC measurement on a single wire or a cable composed of two or more wires (except a shielded cable); during sensing, the detection port is adjusted to a better measurement position of a target wire through rotation and/or movement, so that an electromagnetic signal generated by the target wire passes through the detection port and enters the shielding space to be collected by the Hall sensing module; electromagnetic signals generated by other non-target wires are shielded by the metal shielding shell, thereby avoiding interference, realizing sensing of AC/DC-related electrical parameters, including a current, a voltage, a frequency, a duty cycle, a phase, a harmonic, a frequency-conversion signal, etc., realizing sensing without peeling and branching the cable, ensuring use safety, and being simple and convenient to operate; and in addition, an overall structure is simple and small in size, a traditional silicon steel sheet structure is omitted, so that the non-contact AC/DC sensing probe can work for a long time, cannot lead to the problem of inaccuracy caused by heat, has high measurement precision, can be applied to measuring instruments such as a test pen, a multimeter, and a clamp meter, and has a large application prospect.

The present invention will be further explained below with reference to drawings and embodiments.

DETAILED DESCRIPTION OF EMBODIMENTS

Figure 1:
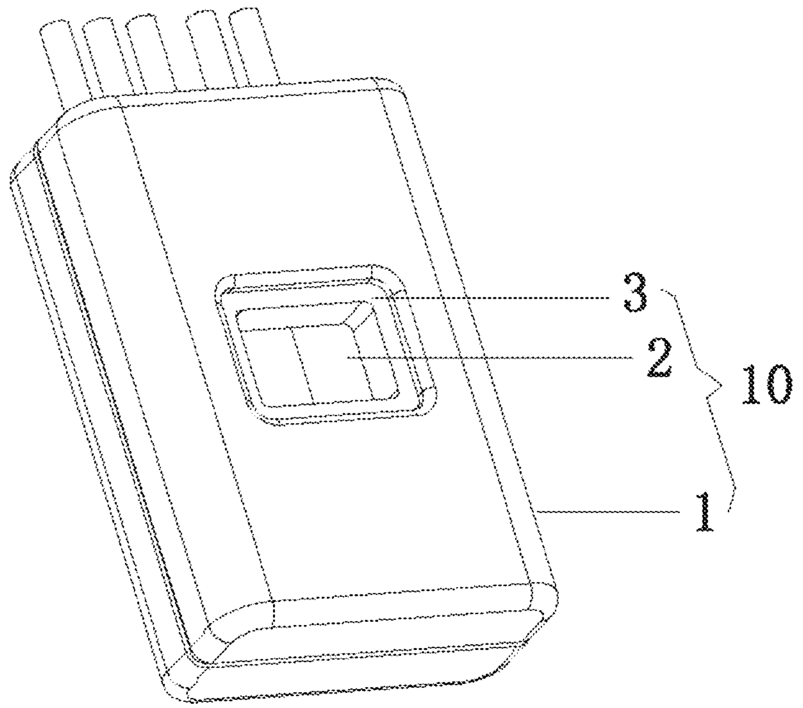
FIG. 1 is a three-dimensional structural schematic diagram of a non-contact AC/DC sensing probe in Embodiment 1 of the present invention.
Figure 2:
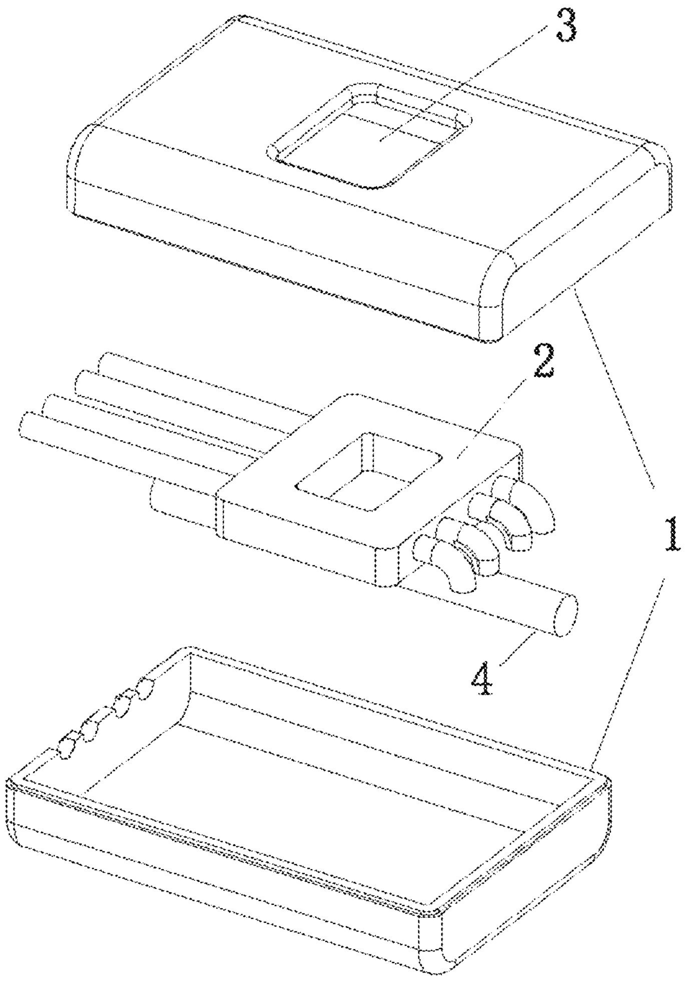
FIG. 2 is an exploded structural schematic diagram of the non-contact AC/DC sensing probe in Embodiment 1 of the present invention.
Figure 3:
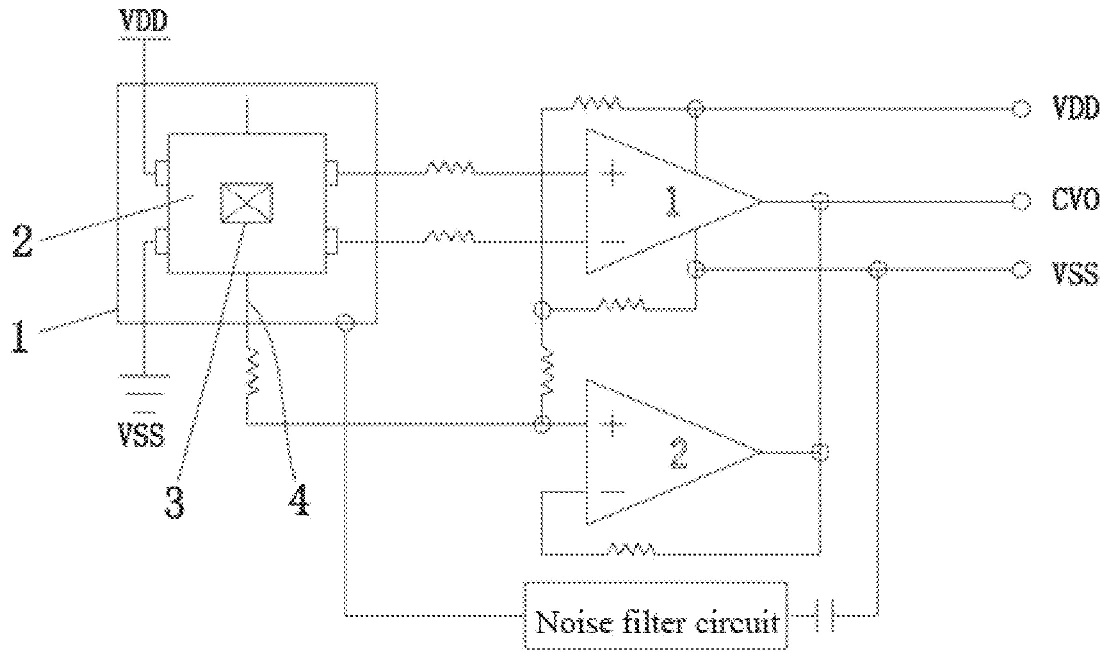
FIG. 3 is a schematic circuit diagram of the non-contact AC/DC sensing probe in Embodiment 1 of the present invention.

Embodiment 1: Referring to FIG. 1, FIG. 2, and FIG. 3, a non-contact AC/DC sensing probe 10 provided in this embodiment comprises a metal shielding shell 1 and a Hall sensing module 2, wherein the metal shielding shell 1 is used for constructing a sealed shielding space for preventing electromagnetic interference; the metal shielding shell 1 is provided with a detection port 3 that can allow an electromagnetic signal in a specific direction to enter the shielding space; and the Hall sensing module 2 is located in the metal shielding shell 1, and is used for sensing the electromagnetic signal that enters the metal shielding shell 1 from the detection port 3. The Hall sensing module 2 has a terminal VDD, a terminal VSS, and a terminal CVO. In this embodiment, the metal shielding shell 1 is a cubic shell body, and in other embodiments, the metal shielding shell 1 may also be in a cylindrical shape or other shapes.

The Hall sensing module comprises a Hall element, a first signal amplification circuit, a second signal amplification circuit, and a noise filter circuit, the Hall element is connected to the first signal amplification circuit, the iron rod is connected to the second signal amplification circuit, and the metal shielding shell is connected to the noise filter circuit, so that unnecessary noise can be filtered.

A sensing method of the non-contact AC/DC sensing probe 10 is as follows: During sensing, a sealed shielding space for preventing electromagnetic interference is constructed through the metal shielding shell 1, and because the metal shielding shell 1 is provided with the detection port 3, the electromagnetic signal in a specific direction can be allowed to enter the detection port 3 in the shielding space, and electromagnetic signals in other directions are shielded. The width of the detection port 3 is preferably 2 mm, and the length is preferably 2-5 mm. The Hall sensing module 2 is fixed in the metal shielding shell 1.

Figure 4:
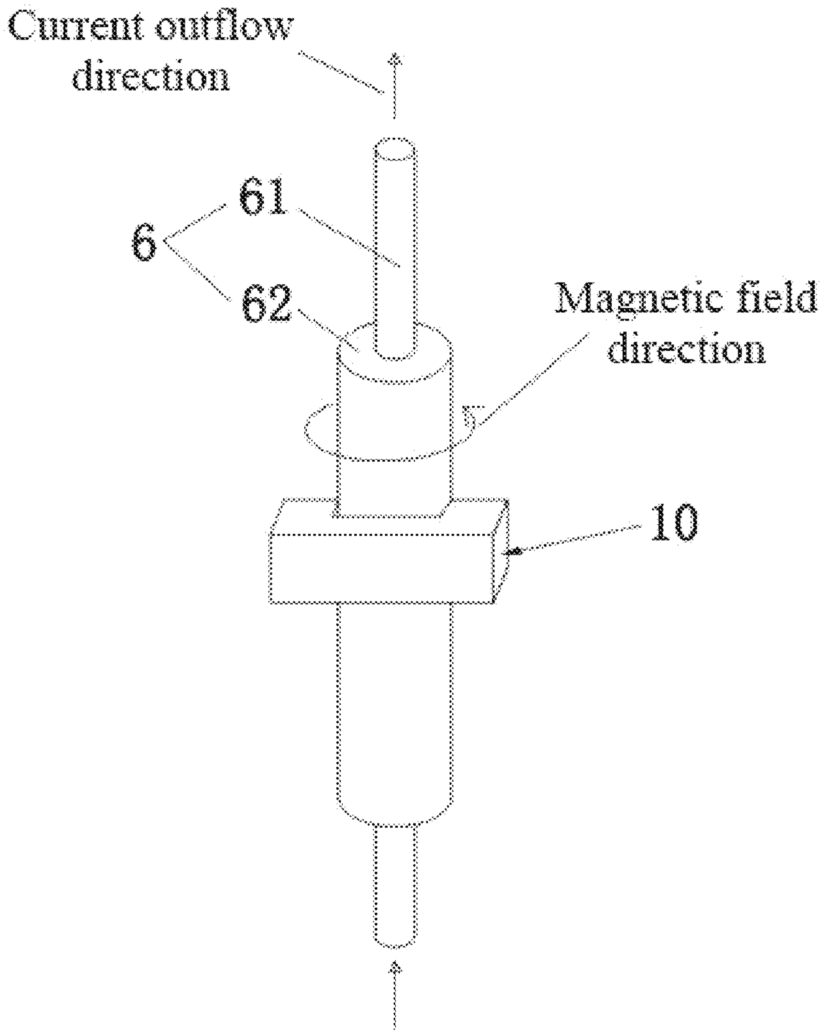
FIG. 4 is a structural schematic diagram 1 of sensing the single wire by the probe in Embodiment 1 of the present invention.
Figure 5:
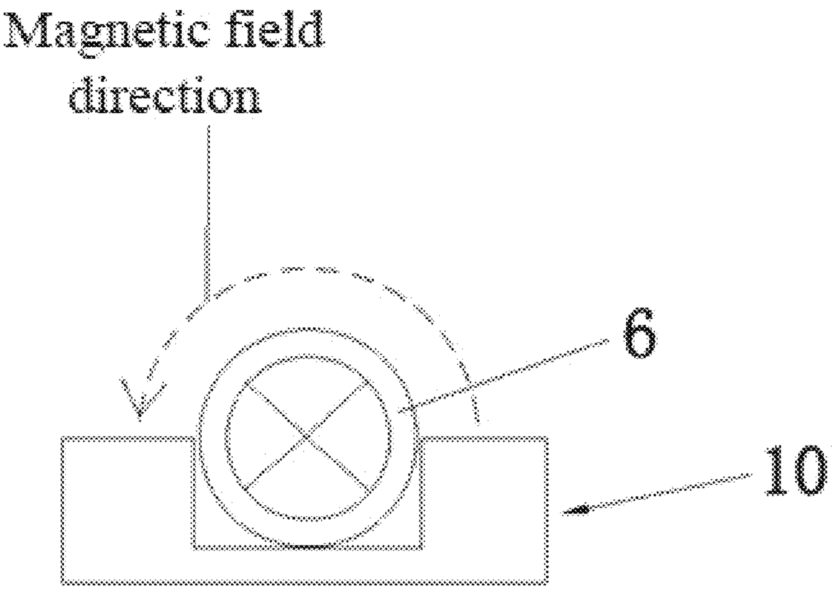
FIG. 5 is a structural schematic diagram 2 of sensing the single wire by the probe in Embodiment 1 of the present invention.
Figure 6:
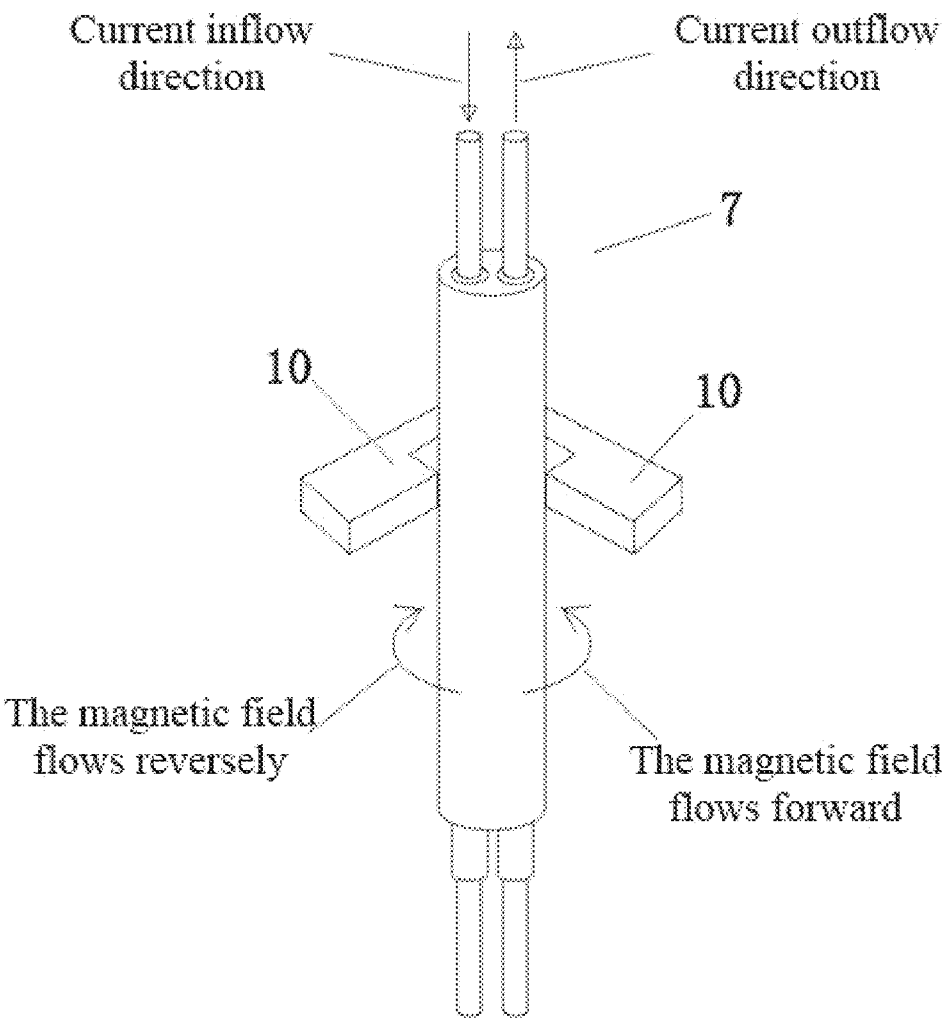
FIG. 6 is a structural schematic diagram 1 of sensing the non-twisted cable by the probe in Embodiment 1 of the present invention.
Figure 7:
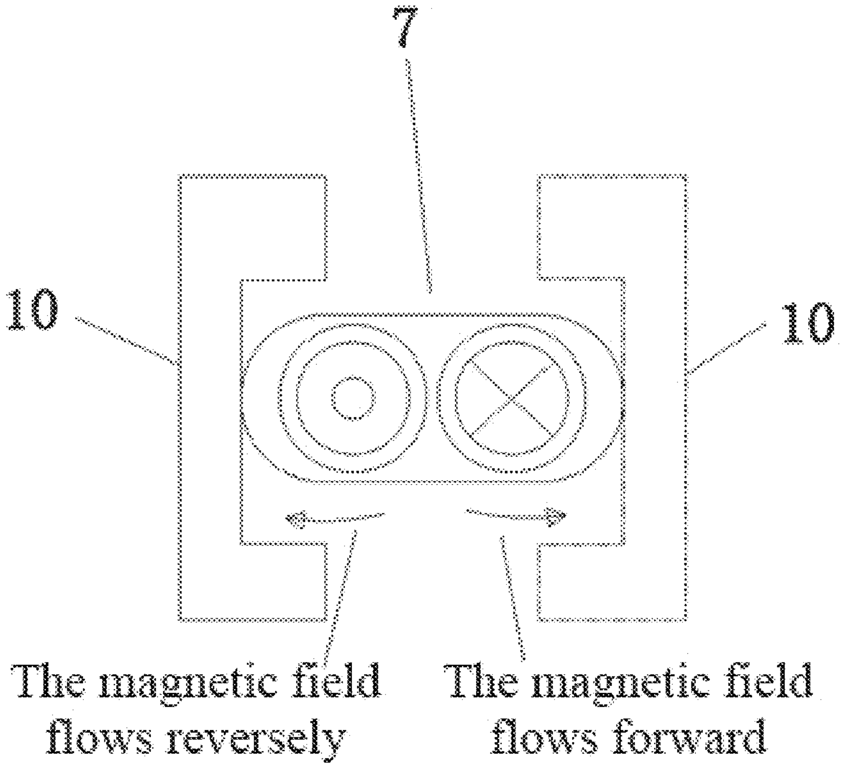
FIG. 7 is a structural schematic diagram 2 of sensing the non-twisted cable by the probe in Embodiment 1 of the present invention.
Figure 8:
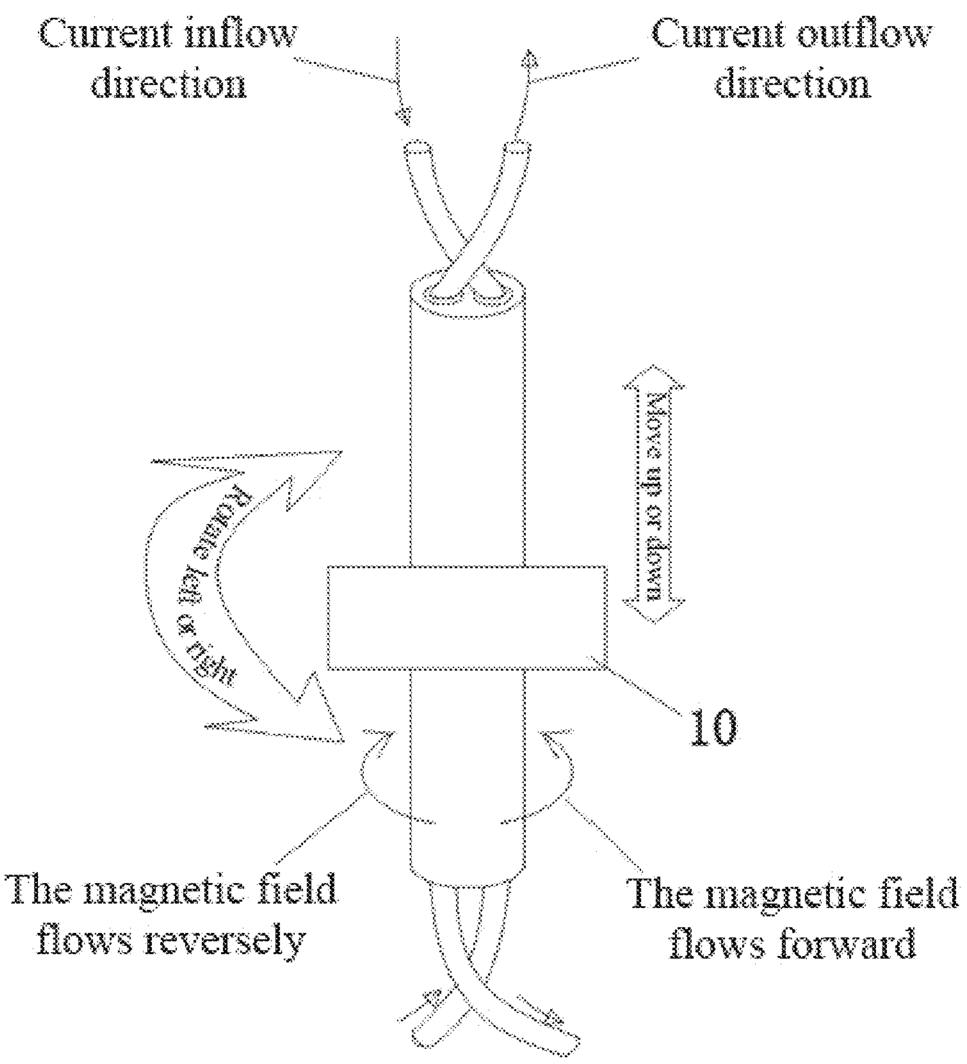
FIG. 8 is a structural schematic diagram 1 of sensing the twisted cable by the probe in Embodiment 1 of the present invention.
Figure 9:
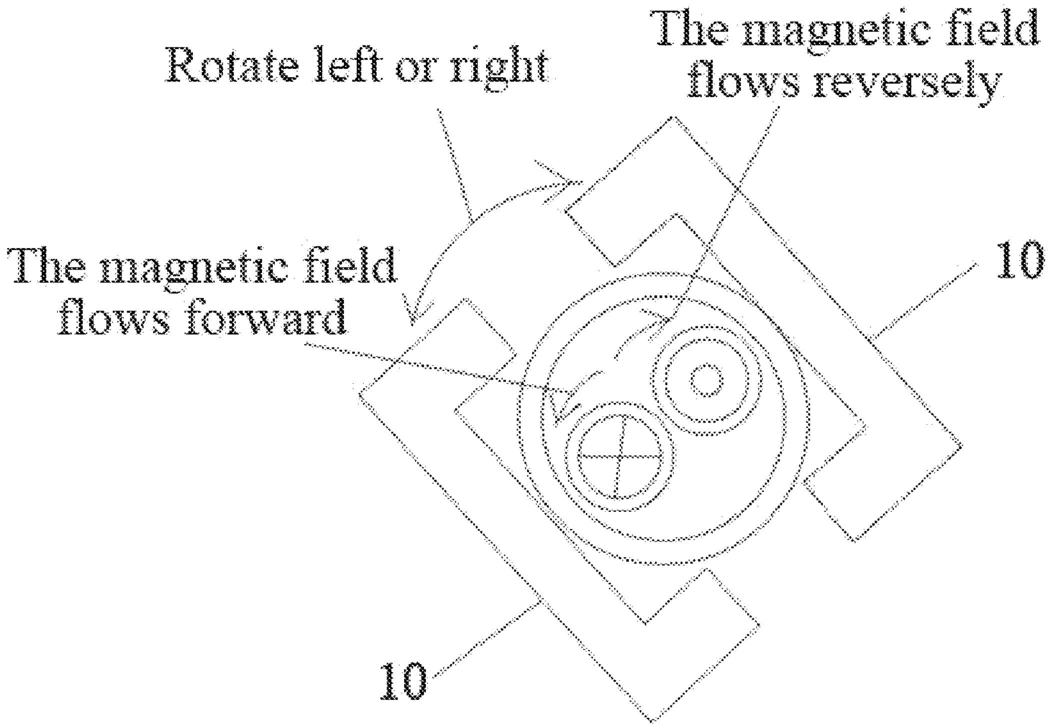
FIG. 9 is a structural schematic diagram 2 of sensing the twisted cable by the probe in Embodiment 1 of the present invention.

During sensing of a single wire 6, referring to FIG. 4 and FIG. 5, the single wire 6 comprises a wire core 61 and an insulation protective layer 62 covering the wire core 61. The detection port 3 is brought close to but not in contact with the single wire, so that an electromagnetic signal generated when an AC/DC current flows in the single wire 6 passes through the detection port 3 and enters the shielding space to be collected by the Hall sensing module 2, and the Hall sensing module 2 outputs a corresponding voltage signal;

during sensing of a non-twisted cable 7 formed by two wires arranged in parallel, referring to FIG. 6 and FIG. 7, the detection port 3 is brought close to but not in contact with the non-twisted cable 7, and then rotated around the non-twisted cable 7, so that the detection port 3 faces the wires in the non-twisted cable 7 one by one, that is, when the detection port 3 is flush with the two wires, and the detection port 3 faces the left wire or the right wire, an electromagnetic signal generated when an AC/DC current flows in the left target wire or the right target wire can be allowed to pass through the detection port 3 and enter the shielding space to be collected by the Hall sensing module 2, and the Hall sensing module 2 outputs a corresponding voltage signal; and during sensing of a twisted cable 8 formed by two wires twisted together, referring to FIG. 8 and FIG. 9, the detection port 3 is brought close to but not in contact with the twisted cable 8, and then rotated left or right (clockwise or counterclockwise) around the twisted cable 8 or moved up or down, and when the detection port is rotated to a corresponding angle or moved to a corresponding position so that the detection port 3 is roughly flush with the two wires, an electromagnetic signal generated when an AC/DC current flows in a target wire at a position of one side close to the detection port 3 can be allowed to pass through the detection port 3 and enter the shielding space to be collected by the Hall sensing module 2, and the Hall sensing module 2 outputs a corresponding voltage signal.

Figure 10:
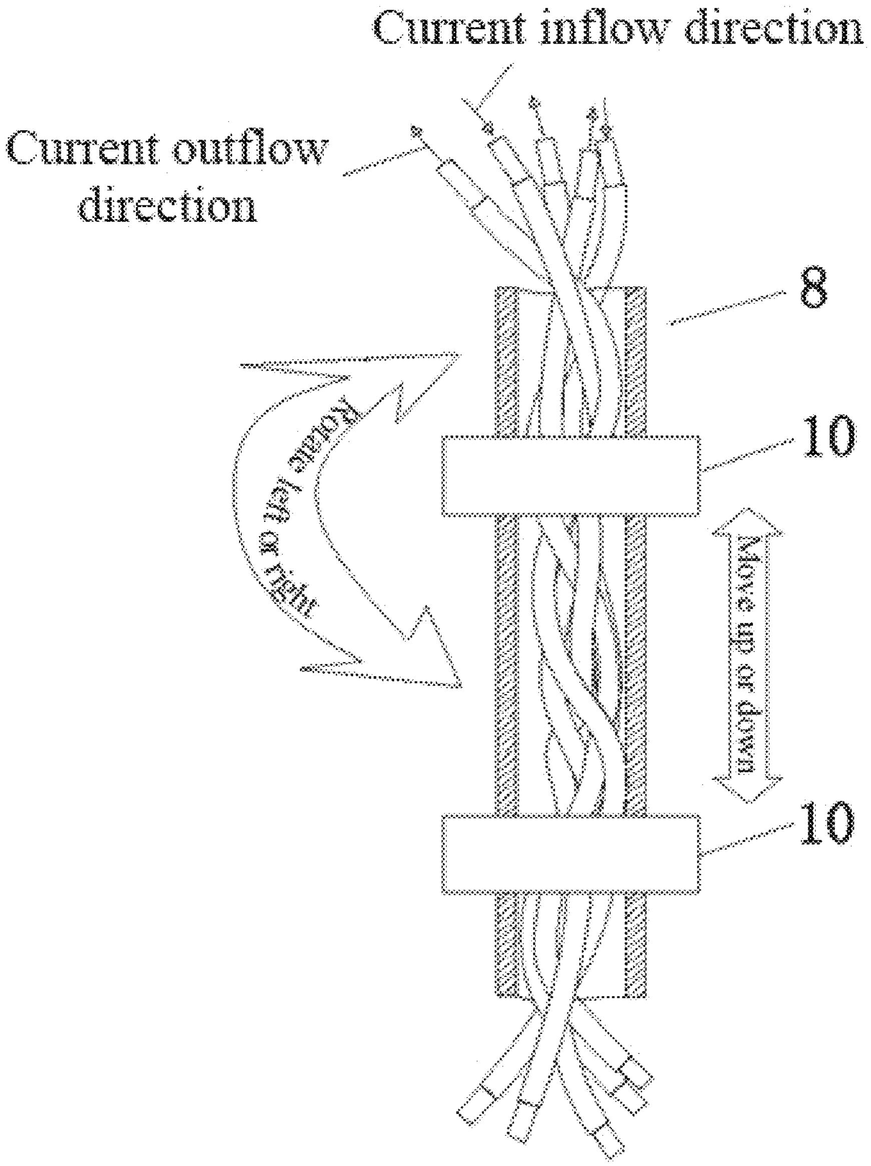
FIG. 10 is a structural schematic diagram 1 of sensing another twisted cable by the probe in Embodiment 1 of the present invention.
Figure 11:
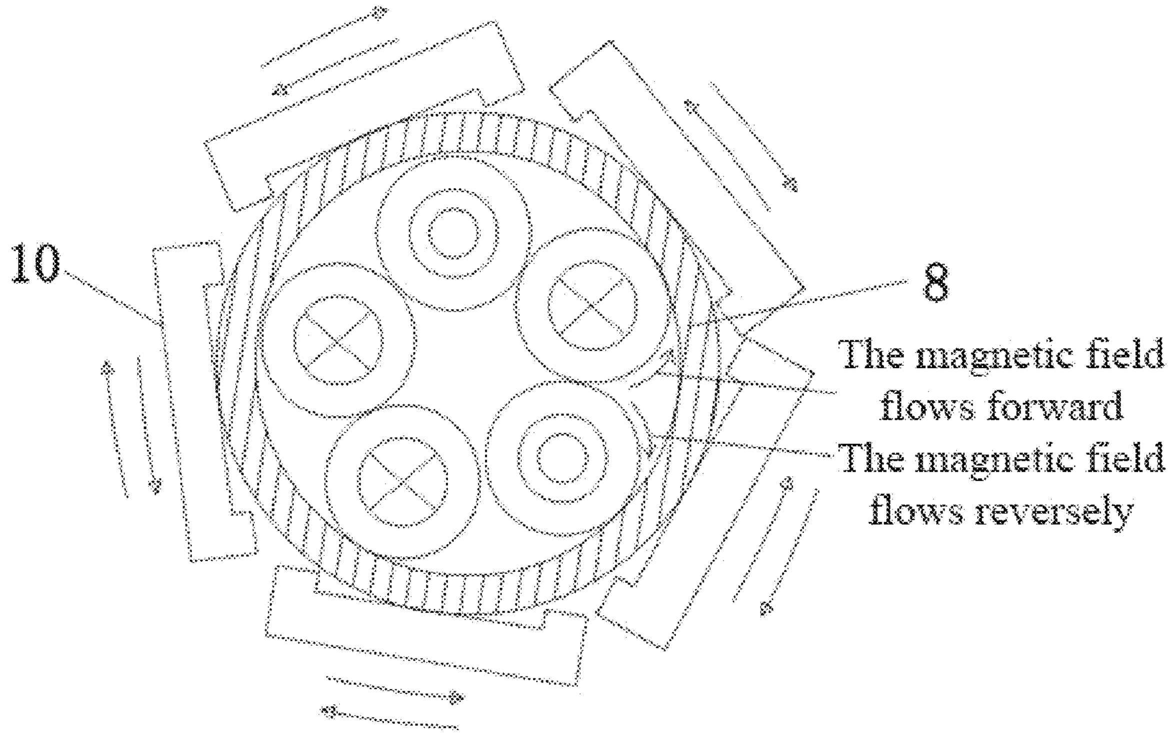
FIG. 11 is a structural schematic diagram 2 of sensing another twisted cable by the probe in Embodiment 1 of the present invention.

During sensing of a twisted cable formed by more than five wires twisted together, referring to FIG. 10 and FIG. 11, the detection port 3 is brought close to but not in contact with the twisted cable, and then rotated left or right around the twisted cable and moved up or down along the central axial direction of the twisted cable at the same time, so that the detection port 3 can find a better measurement position facing a target wire during the movement adjustment process, because when the detection port faces the target wire, a sensing value will increase to the highest value, and an electromagnetic signal generated when an AC/DC current flows in the target wire in the twisted cable can be allowed to pass through the detection port 3 and enter the shielding space to be collected by the Hall sensing module 2, and the Hall sensing module 2 outputs a corresponding voltage signal.

Figure 12:
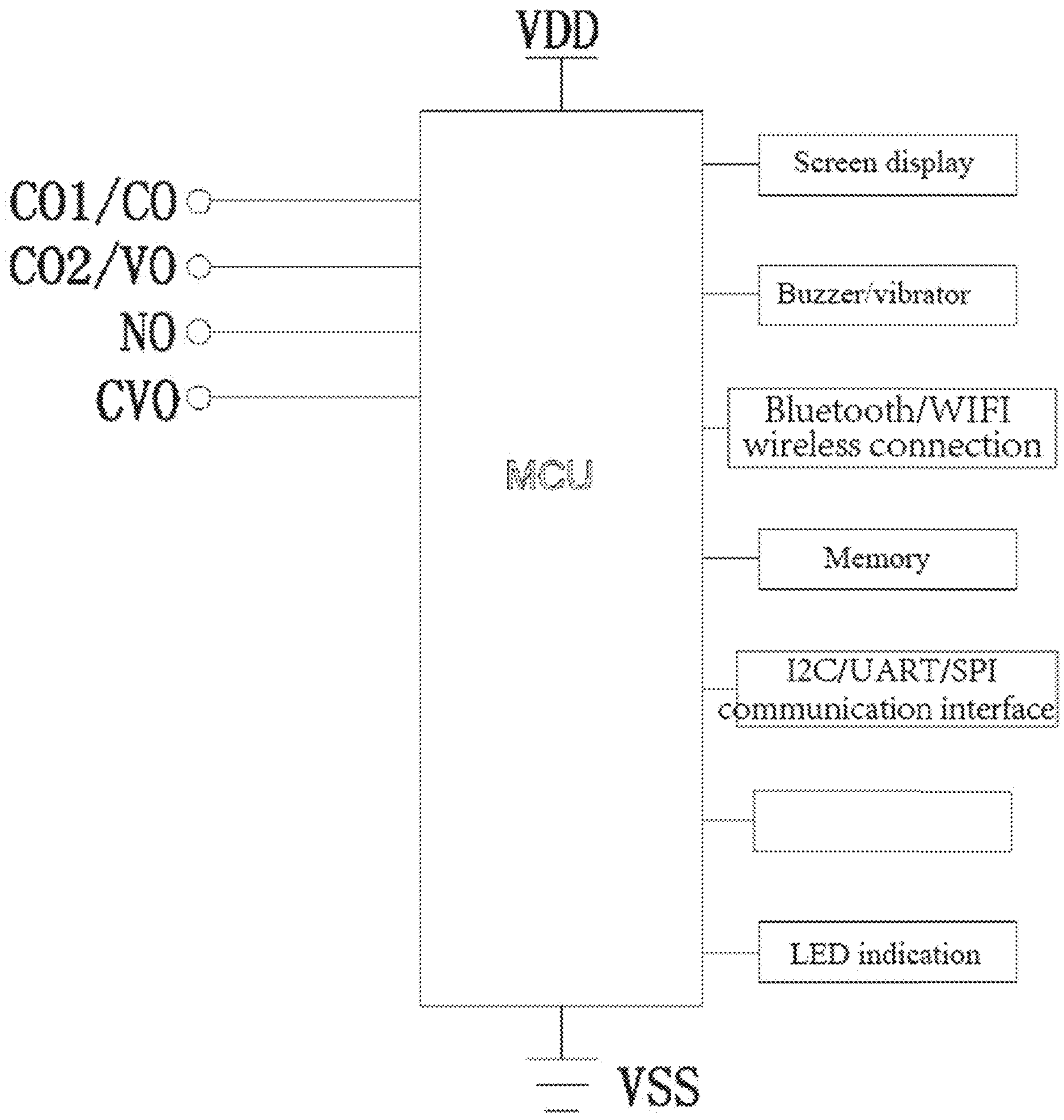
FIG. 12 is a schematic diagram of a connection port of a main control MCU chip in Embodiment 1 of the present invention.

Referring to FIG. 12, an MCU chip of a model of STM8L151 or ML54/56 series may be chosen as the main control MCU chip. The main control MCU chip is connected to the non-contact alternating current sensing probe 10 through the terminal VDD, the terminal VSS, and the terminal CVO. Through analytic operation processing of the main control MCU chip on the corresponding current signal output by the non-contact alternating current sensing probe 10, related electrical parameters are obtained, such as a current, a voltage, a frequency, a duty cycle, a phase, a harmonic, and a frequency-conversion signal.

Current: When a current flows in a wire, a corresponding magnetic field will be generated, and this magnetic field is proportional to a value of the current. This magnetic field can be captured and collected by the Hall sensing module 2, which will convert the magnetic field into a voltage signal for being output, and after this voltage signal is amplified by a circuit, a load current can be displayed.

Voltage: An electromagnetic field change can be detected according to the electromagnetic induction principle, so as to obtain voltage information, and measure a value of the voltage.

Frequency: In an alternating current circuit, periodic changes in the current and voltage correspond to specific frequencies, and through analyzing a period and a frequency of an electromagnetic signal, a transmission frequency of a wire can be determined.

Duty cycle: A Duty cycle refers to a proportional relationship between high level duration and a period in a periodic signal. Through detecting changes in a pulse width or signal intensity of an electromagnetic signal, a duty cycle of the signal can be analyzed and measured.

Phase: A phase in an electromagnetic signal can be measured based on a time difference between the starting point of a detected signal and the starting point of a reference signal. This is to describe an offset relationship of a periodic signal in timeline based on the phase, and a transmission speed and time delay of an electromagnetic wave is used to determine phase information.

Harmonic: Through analyzing a spectrum of an electromagnetic signal, a harmonic component in a wire can be detected. A harmonic refers to a periodic signal component whose frequency is an integer multiple of a fundamental frequency. A nonlinear load will cause distortion of a current or voltage, then the harmonic is generated, and through detecting and analyzing the spectrum of the electromagnetic signal, the existence and value of the harmonic component can be determined.

Frequency-conversion signal: The Hall sensing module 2 is used to induce a magnetic field change generated from a current in a wire, to detect the frequency-conversion signal.

Figure 13:
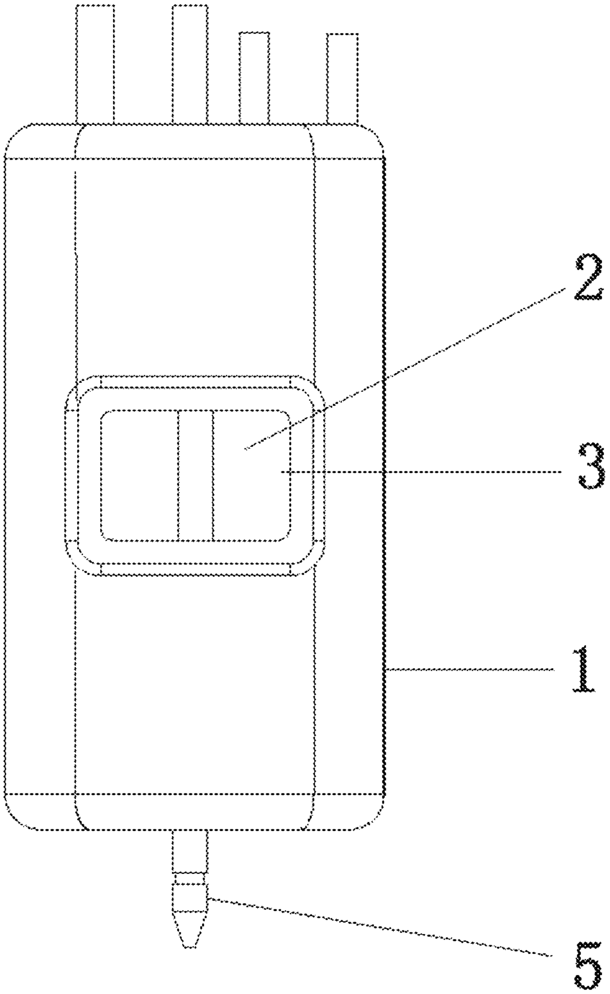
FIG. 13 is a structural schematic diagram of a non-contact AC/DC sensing probe in Embodiment 2 of the present invention.
Figure 14:
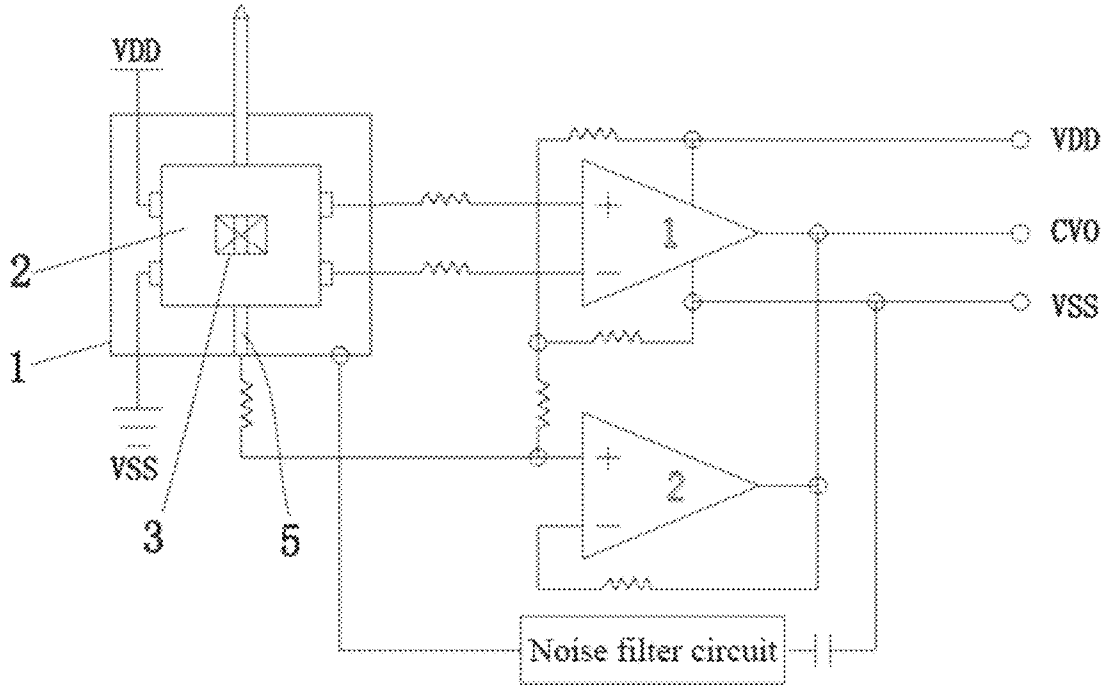
FIG. 14 is a schematic circuit diagram of the non-contact AC/DC sensing probe in Embodiment 2 of the present invention.

Embodiment 2: Referring to FIG. 13 and FIG. 14, a non-contact AC/DC sensing probe provided in this embodiment has a structure basically the same as that of Embodiment 1, and a difference lies in that a feeler pin 5 of a test pen is adopted to replace the iron rod 4. For example, the test pen may be a test pen of a multimeter, further improving functions of the multimeter.

The non-contact AC/DC sensing probe can be applied to a test pen or measuring instrument. For details, refer to the following application examples.

Figure 15:
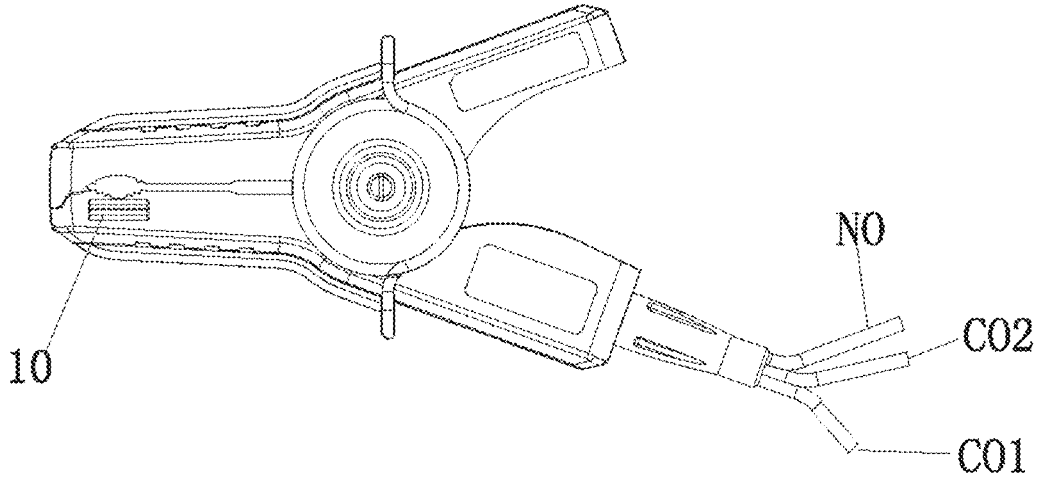
FIG. 15 is a structural schematic diagram of a product of Application example 1 of the present invention.

Application example 1: Referring to FIG. 15, the non-contact AC/DC sensing probe 10 provided in Embodiment 1 or 2 can be applied to a multi-functional induction clamp head, and the non-contact AC/DC sensing probe 10 is located at the inner side of an arc recess of a clamping opening of the multi-functional induction clamp head.

Figure 16:
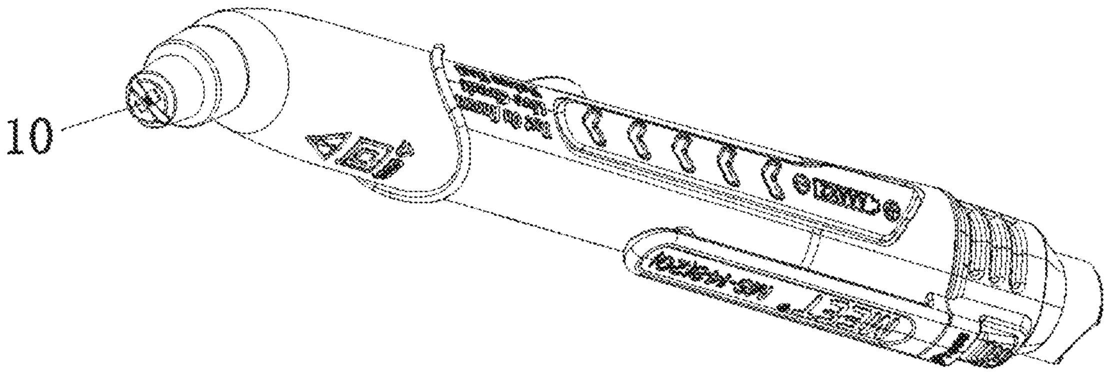
FIG. 16 is a structural schematic diagram of a product of Application example 2 of the present invention.

Application example 2: Referring to FIG. 16, the non-contact AC/DC sensing probe 10 provided in Embodiment 1 or 2 can be applied to a dual-sensing ammeter, and the non-contact AC/DC sensing probe 10 is located at the inner side of an arc recess of a detection head of the dual-sensing ammeter.

Figure 17:
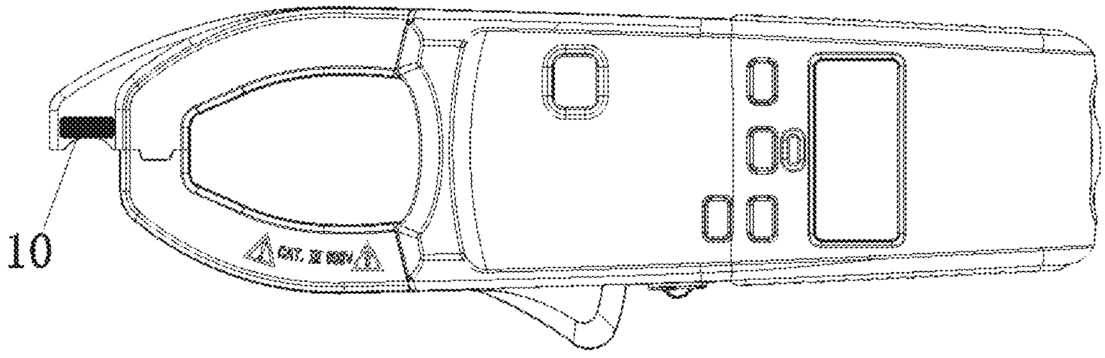
FIG. 17 is a structural schematic diagram of a product of Application example 3 of the present invention.

Application example 3: Referring to FIG. 17, the non-contact AC/DC sensing probe 10 provided in Embodiment 1 or 2 can be applied to a non-contact clamp meter, a protrusion portion is arranged at a position of a jaw of the non-contact clamp meter, and the non-contact AC/DC sensing probe 10 is located in the protrusion portion. During detection, the protrusion portion is just brought close to a wire and cable to be detected.

Figure 18:
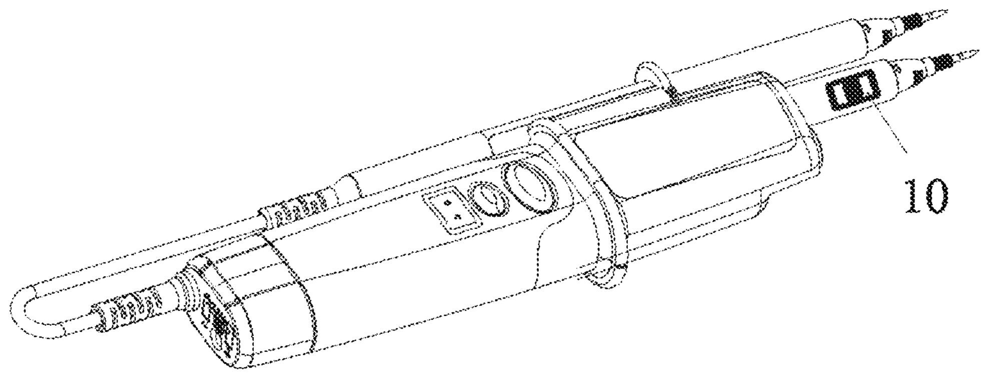
FIG. 18 is a structural schematic diagram of a product of Application example 4 of the present invention.

Application example 4: Referring to FIG. 18, the non-contact AC/DC sensing probe 10 provided in Embodiment 1 or 2 can be applied to an electrical tester, the electrical tester has a fixed gauge pen, and the non-contact AC/DC sensing probe 10 is located at the inner side of a pen body of the fixed gauge pen. During detection, the pen body of the fixed gauge pen is just brought close to a wire and cable to be detected.

Figure 19:
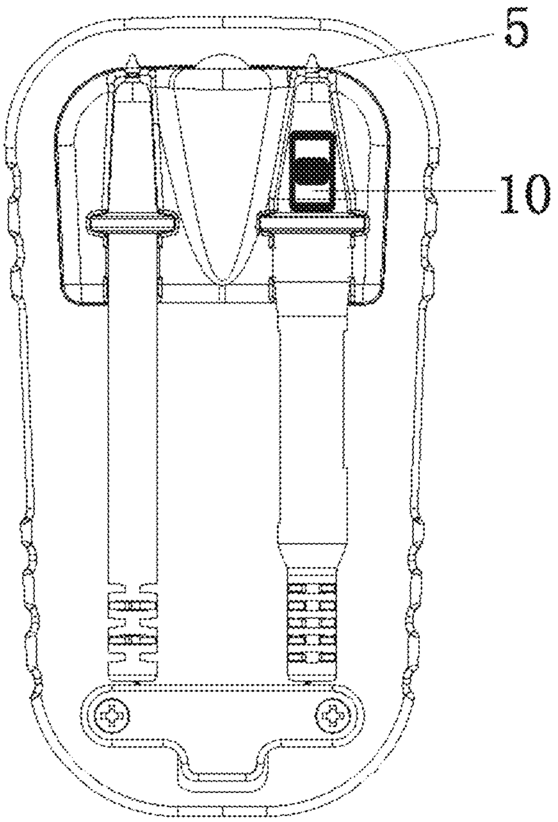
FIG. 19 is a structural schematic diagram of a product of Application example 5 of the present invention.

Application example 5: Referring to FIG. 19, the non-contact AC/DC sensing probe 10 provided in Embodiment 1 or 2 can be applied to a head position of a test pen of a multimeter, and during detection, the head of the test pen is just brought close to a wire and cable to be detected.

Figure 20:
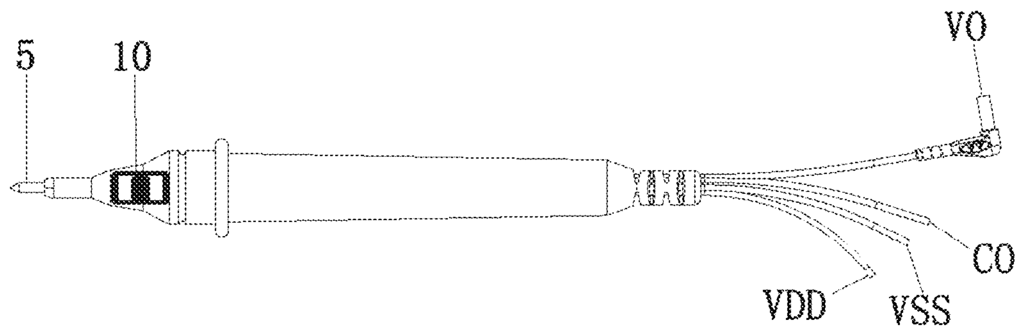
FIG. 20 is a structural schematic diagram of a product of Application example 6 of the present invention.

Application example 6: Referring to FIG. 20, the non-contact AC/DC sensing probe 10 provided in Embodiment 1 or 2 can be applied to a head position of a multi-functional lead, and during detection, the head of the multi-functional lead is just brought close to a wire and cable to be detected.

Figure 21:
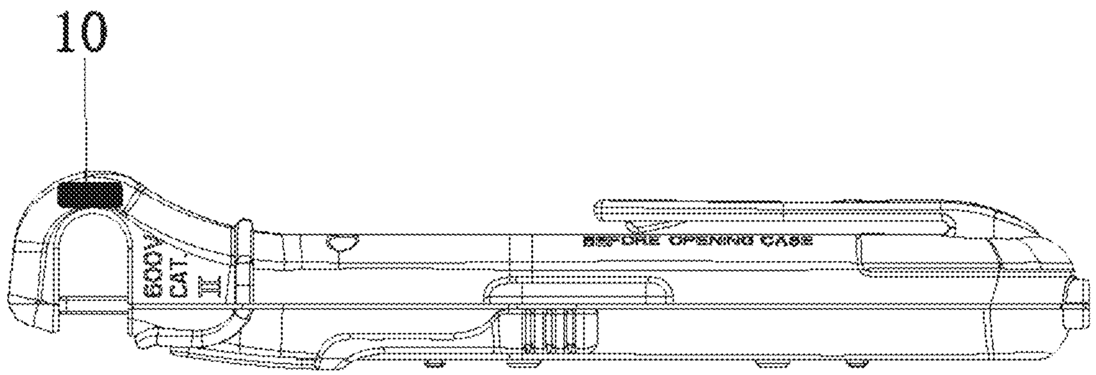
FIG. 21 is a structural schematic diagram of a product of Application example 7 of the present invention.

Application example 7: Referring to FIG. 21, the non-contact AC/DC sensing probe 10 provided in Embodiment 1 or 2 can be applied to a head detection position of a pen-type meter, and during detection, a wire and cable to be detected are just placed into the head detection position of the pen-type meter.

Figure 22:
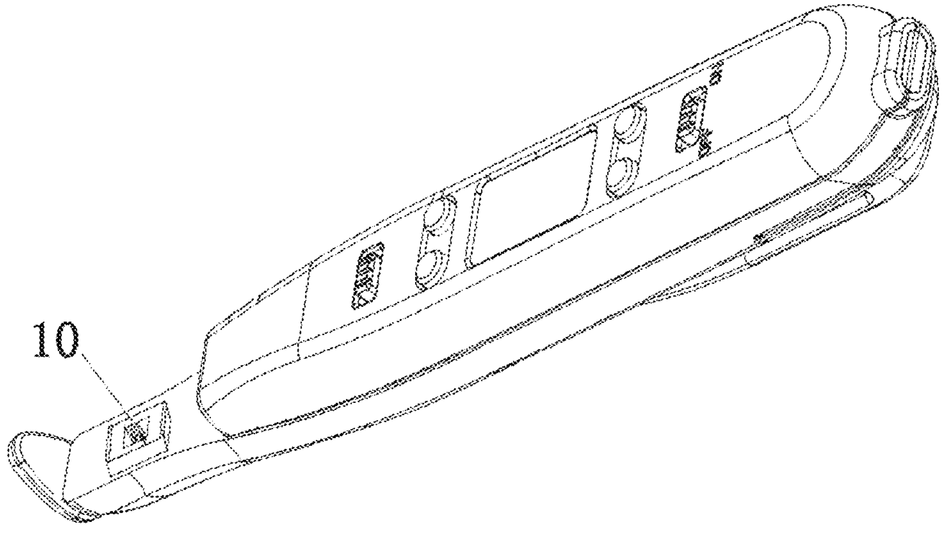
FIG. 22 is a structural schematic diagram of a product of Application example 8 of the present invention.

Application example 8: Referring to FIG. 22, the non-contact AC/DC sensing probe 10 provided in Embodiment 1 or 2 can be applied to a head detection position of a multi-functional electricity meter, and during detection, a wire and cable to be detected are just placed into the head detection position of the multi-functional electricity meter.

The above embodiments and application examples are only preferred embodiments and application modes of the present invention, the present invention cannot list them one by one, and all technical solutions adopting one of the foregoing embodiments or application modes, or equivalent changes made according to the foregoing embodiments, are within the protection scope of the present invention.

The measuring instrument adopting the non-contact AC/DC sensing probe 10 of the present invention can directly perform AC/DC measurement on a single wire or a cable composed of two or more wires (except a shielded cable), to obtain electrical parameters, such as a current, a voltage, a frequency, a duty cycle, a phase, a harmonic, and a frequency-conversion signal. Generally speaking, the present invention has the following advantages:

1. Measurement can be performed on a single wire or a cable including a plurality of wires (except a shielded wire), the cable can be sensed without being peeled and branched, use safety is ensured, and operations are simple and convenient.
2. The Hall sensing module is adopted, the limitation that a traditional induction coil can sense only an AC current is broken through, and sensing can be performed on an AC or DC current; and corresponding electrical parameters can be obtained through operation processing of the main control MCU chip, and a result can be displayed.
3. A traditional silicon steel sheet structure is omitted, and the non-contact AC/DC current sensing probe can work for a long time, and cannot lead to the problem of inaccuracy caused by heat.
4. The main control MCU chip can use wireless connection manners such as Bluetooth and Wi-Fi to share data mutually with smartphones, tablets, and computers, and operations are simple and convenient.

Based on the disclosure and teachings of the foregoing specification, those skilled in the art to which the present invention belongs can also make changes and modifications to the foregoing implementation manners. Therefore, the present invention is not limited to the specific implementation manners disclosed and described above, and some modifications and changes made to the present invention shall also fall within the protection scope of the claims of the present invention. In addition, although some specific terms are used in this specification, these terms are only for convenience of explanation and do not constitute any limitation on the present invention. As described in the foregoing embodiments of the present invention, other structures and methods obtained by using the same or similar steps thereof are within the protection scope of the present invention.

What is claimed is:

1. A non-contact AC/DC sensing method, comprising the following steps:

constructing a sealed shielding space for preventing electromagnetic interference by a metal shielding shell, the metal shielding shell is provided with a detection port that can allow an electromagnetic signal in a specific direction to enter the shielding space, and arranging, in the shielding space, a Hall sensing module that can collect the electromagnetic signal passing through the detection port to enter the shielding space; an iron rod for enhancing sensitivity of the Hall sensing module to a magnetic field change is arranged beside the Hall sensing module; wherein the Hall sensing module comprises a Hall element, a first signal amplification circuit, a second signal amplification circuit, and a noise filter circuit, the Hall element is connected to the first signal amplification circuit, the iron rod is connected to the second signal amplification circuit, and the metal shielding shell is connected to the noise filter circuit;

during sensing of a single wire, enabling the detection port to be close to but not in contact with the single wire, so that an electromagnetic signal generated when an AC/DC current flows in the single wire can be allowed to pass through the detection port to enter the shielding space to be collected by the Hall sensing module, and the Hall sensing module outputs a corresponding voltage signal;

during sensing of a non-twisted cable formed by two or more wires arranged in parallel, enabling the detection port to be close to but not in contact with the non-twisted cable, and then rotating around the non-twisted cable, so that the detection port faces the wires in the non-twisted cable one by one, and an electromagnetic signal generated when an AC/DC current flows in a target wire in the non-twisted cable can be allowed to pass through the detection port to enter the shielding space to be collected by the Hall sensing module, and the Hall sensing module outputs a corresponding voltage signal; and during sensing of a twisted cable formed by two or more wires twisted together, enabling the detection port to be close to but not in contact with the twisted cable, and then rotating around the twisted cable and/or moving along a direction of a central axis of the twisted cable, so that an electromagnetic signal generated when an AC/DC current flows in a target wire in the twisted cable can be allowed to pass through the detection port to enter the shielding space to be collected by the Hall sensing module, and the Hall sensing module outputs a corresponding voltage signal.

2. The non-contact AC/DC sensing method according to claim 1, wherein the voltage signal output by the Hall sensing module is subjected to analytic operation processing by a main control MCU chip, to obtain related electrical parameters.

3. The non-contact AC/DC sensing method according to claim 2, wherein the electrical parameters comprise a current, a voltage, a frequency, a duty cycle, a phase, a harmonic, and a frequency-conversion signal.

4. A non-contact AC/DC sensing probe for implementing the non-AC/DC sensing method according to claim 1, comprising a metal shielding shell used for constructing a sealed shielding space for preventing electromagnetic interference; wherein the metal shielding shell is provided with a detection port that can allow an electromagnetic signal in a specific direction to enter the shielding space; and a Hall sensing module used for sensing the electromagnetic signal that enters the metal shielding shell from the detection port and outputting a corresponding voltage signal;

wherein an iron rod for enhancing sensitivity of the Hall sensing module to a magnetic field change is arranged beside the Hall sensing module;

wherein the Hall sensing module comprises a Hall element, a first signal amplification circuit, a second signal amplification circuit, and a noise filter circuit, the Hall element is connected to the first signal amplification circuit, the iron rod is connected to the second signal amplification circuit, and the metal shielding shell is connected to the noise filter circuit.

5. The non-contact AC/DC sensing probe according to claim 4, wherein the iron rod is a feeler pin of a test pen.

6. The non-contact AC/DC sensing probe according to claim 4, applied to a test pen.

7. The non-contact AC/DC sensing probe according to claim 4, applied to a measuring instrument.

* * * * *